(12) United States Patent
Lee et al.

(10) Patent No.: US 7,939,815 B2
(45) Date of Patent: May 10, 2011

(54) FORMING A CARBON PASSIVATED OVONIC THRESHOLD SWITCH

(75) Inventors: Jinwook Lee, San Jose, CA (US); Kuo-wei Chang, Cupertino, CA (US); Jason S. Reid, San Jose, CA (US); Wim Y. Deweerd, San Jose, CA (US); Aleshandre M. Diaz, San Mateo, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 214 days.

(21) Appl. No.: 12/346,705

(22) Filed: Dec. 30, 2008

(65) Prior Publication Data
US 2010/0163818 A1    Jul. 1, 2010

(51) Int. Cl.
*H01L 29/02* (2006.01)

(52) U.S. Cl. 257/2; 257/3; 257/4; 257/13; 257/E29.105; 438/900

(58) Field of Classification Search ................ None
See application file for complete search history.

(56) References Cited

U.S. PATENT DOCUMENTS 5,159,661 A * 10/1992 Ovshinsky et al. ............. 706/33
5,414,271 A * 5/1995 Ovshinsky et al. ............... 257/3

* cited by examiner

*Primary Examiner* — Evan Pert
*Assistant Examiner* — Scott Wilson
(74) *Attorney, Agent, or Firm* — Lisa K. Jorgenson; Robert Iannucci; Seed IP Law Group PLLC

(57) ABSTRACT

By making an ovonic threshold switch using a carbon interfacial layer having a thickness of less than or equal to ten percent of the thickness of the associated electrode, cycle endurance may be improved. In some embodiments, a glue layer may be used between the carbon and the chalcogenide of the ovonic threshold switch. The glue layer may be effective to improve adherence between carbon and chalcogenide.

36 Claims, 5 Drawing Sheets

FORMING A CARBON PASSIVATED OVONIC THRESHOLD SWITCH

BACKGROUND

1. Technical Field

This invention relates generally to phase change memories.

2. Description of the Related Art

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change material is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF SUMMARY

One embodiment is an ovonic threshold switch that includes a first electrode, an ovonic threshold switch material, and a carbon layer between the first electrode and the ovonic threshold switch material. The carbon layer has a thickness of less than ten percent of the thickness of said first electrode.

DETAILED DESCRIPTION

Figure 1:
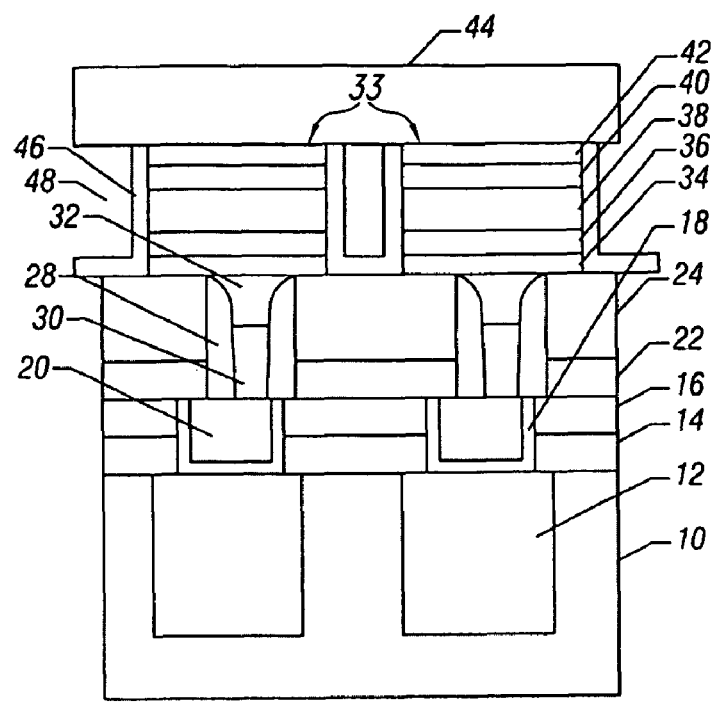
FIG. 1 is an enlarged, cross-sectional view of one embodiment of the present invention.

In accordance with some embodiments, an ovonic unified memory (OUM) may be formed with a stacked ovonic threshold switch which is carbon passivated. Namely, the interface between the middle and upper electrodes to the chalcogenide material forming the ovonic threshold switch may be formed of a relatively thin layer of carbon. A glue layer may be used to adhere the carbon layer to the chalcogenide material that forms the ovonic threshold switch. By virtue of the carbon passivation, the cycle endurance reliability of the device may be substantially increased in some embodiments.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistant state so that little or no electrical current passes.

Alternatively, if a voltage potential greater than the threshold voltage of the select device is applied across the device, then the device may turn on, i.e., operate in a relatively low resistance state so that electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantially amorphous state, positioned between two electrodes, that may be repeatedly and reversibly switched between a higher resistance off state that is greater than about 10 megaOhms and a relatively lower resistance on state that is about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a programmable material and, as a result, the switch may not be a memory device capable of storing information. For example, the switching material may remain permanently amorphous and the IV characteristics may remain the same throughout the operating life.

In the low voltage, a low electric field mode, where the voltage applied across the switch is less than the threshold voltage $V_{th}$, the switch may be off or non-conducting and exhibits a relatively high resistance (greater than about 10 megaOhms). The switch may remain in the off state until its sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

Referring to FIG. 1, a phase change memory may include a structure formed over a semiconductor substrate (not indicated in FIG. 1). Over the substrate may be an interlayer dielectric 10. The substrate may include other integrated components which are isolated by the interlayer dielectric 10. Formed in the interlayer dielectric may be metal lines 12 which, in one embodiment, may be copper row lines.

Over the metal lines 12 may be formed a plug 20 in an intervening nitride layer 14 and oxide layer 16. A barrier layer 18 may be used to chemically isolate the plug 20. Then, the actual memory element may be formed in a pair of dielectric layers 22 and 24 in one embodiment. Sidewall spacers 28 may be formed in a pore that is formed in the dielectric layers 22, 24 and filled with a heater 30 and a phase change material 32, such as a chalcogenide or pnictide in one embodiment.

Above the phase change material 32 is an ovonic threshold switch 33. It includes a middle electrode 34, a carbon interfacial layer 36, a chalcogenide 38 that normally does not change from the amorphous phase, another carbon interfacial layer 40, and an upper electrode 42. Thereover may be formed a metal line 44, such as a copper column line.

Figure 2:
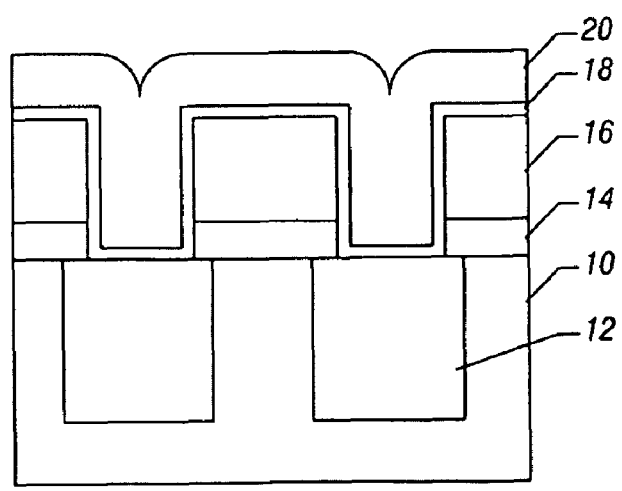
FIG. 2 is an enlarged, cross-sectional view at an early stage of manufacture in accordance with one embodiment of the present invention.

The formation of the structure shown in FIG. 1 is illustrated in FIGS. 2-8 in accordance with one embodiment. Referring to FIG. 2, the interlayer dielectric 10 may be patterned and etched to form trenches and metal may be deposited in the resulting etched trenches. Then, the metal may be planarized to form the metal lines 12.

Figure 3:
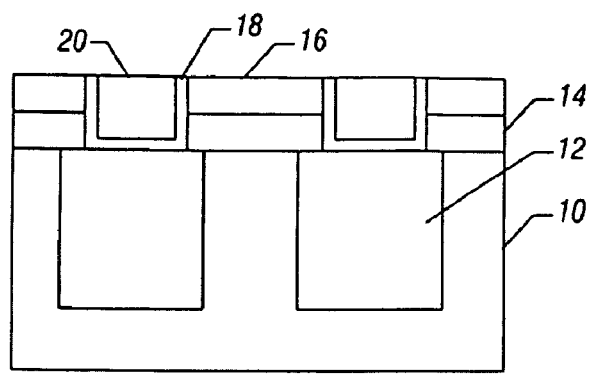
FIG. 3 is an enlarged, cross-sectional view at a stage subsequent to that shown in FIG. 2 in accordance with one embodiment.

Thereafter, the nitride layer 14 may be blanket deposited, followed by the oxide layer 16. Other dielectrics may also be used. Next, patterning and etching of the resulting stack forms a trench to receive the barrier layer 18, which may be formed of copper, and the plug 20. The plug 20 may be formed of titanium nitride or titanium silicon nitride, as two examples. The plug material and the barrier layer 18 may be planarized to form a planar upper surface, as shown in FIG. 3.

Figure 4:
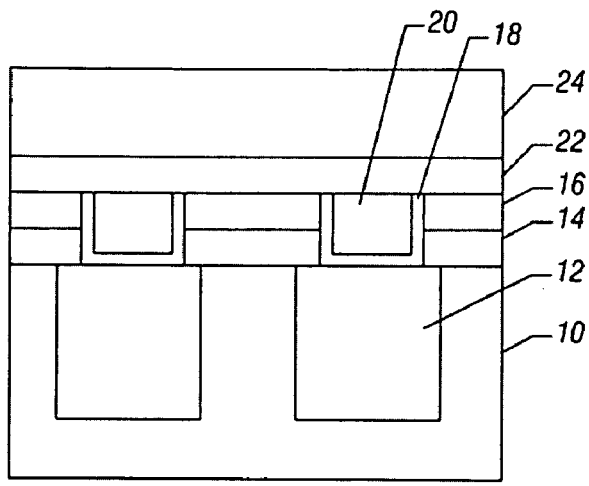
FIG. 4 is an enlarged, cross-sectional view at a stage subsequent to that shown in FIG. 3 in accordance with one embodiment.
Figure 5:
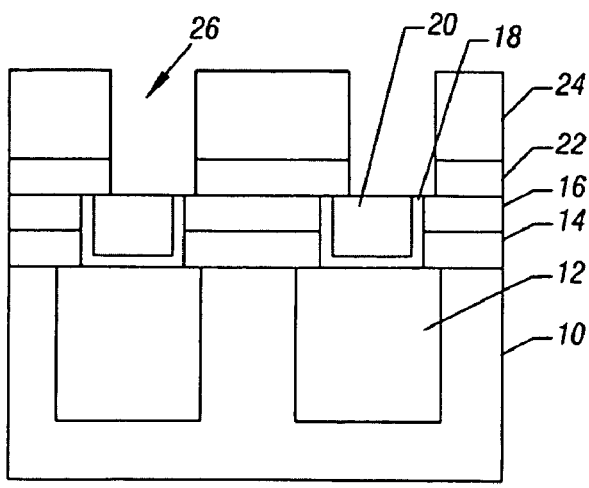
FIG. 5 is an enlarged, cross-sectional view at a stage subsequent to that shown in FIG. 4 in accordance with one embodiment.
Figure 6:
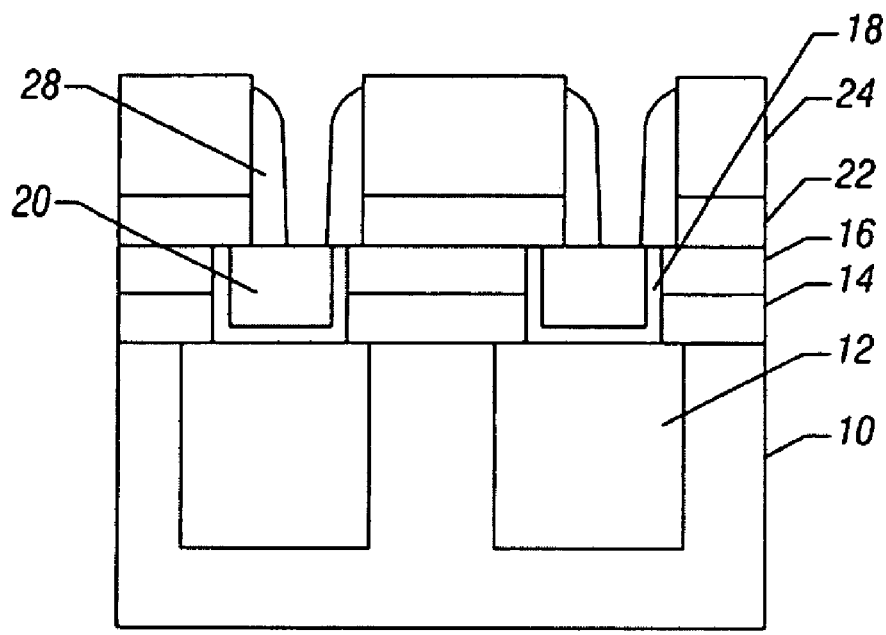
FIG. 6 is an enlarged, cross-sectional view at a stage subsequent to that shown in FIG. 5 in accordance with one embodiment.
Figure 7:
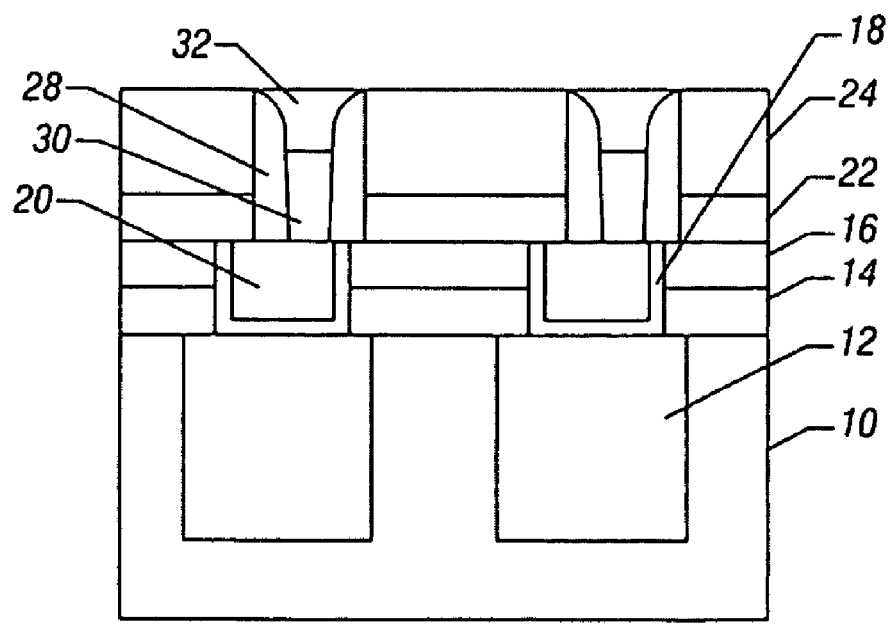
FIG. 7 is an enlarged, cross-sectional view at a stage subsequent to that shown in FIG. 6 in accordance with one embodiment.
Figure 8:
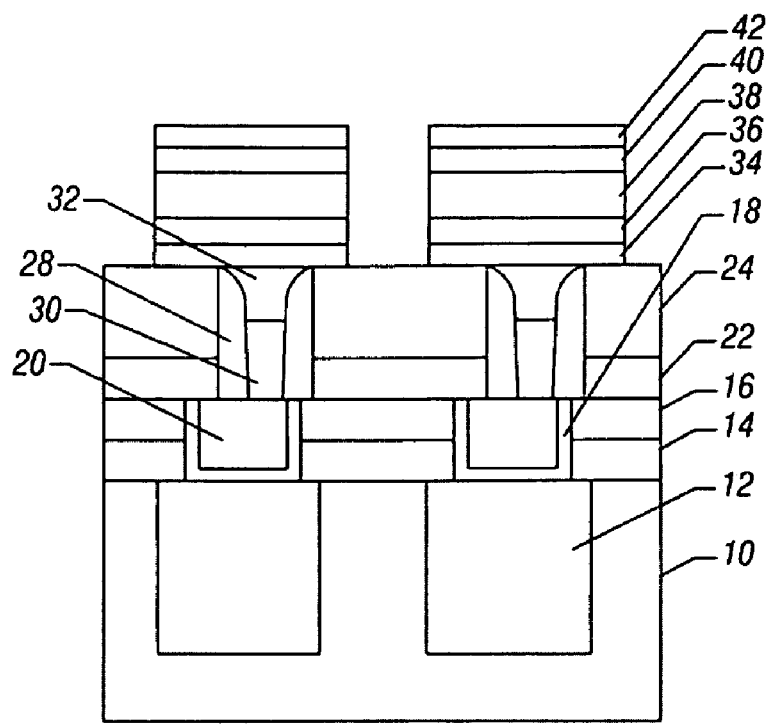
FIG. 8 is an enlarged, cross-sectional view at a stage subsequent to that shown in FIG. 7, and prior to the stage shown in FIG. 1, in accordance with one embodiment.

Then, a lance nitride layer 22 may be formed, which is covered by a lance oxide layer 24, as shown in FIG. 4. Patterning and etching may be used to form pores 26 in the dielectric layers 22, 24, shown in FIG. 5, generally aligned over the plug 20. The spacers 28 may be formed in the pores using a blanket deposition of a spacer material, such as oxide, followed by an anisotropic etch, as shown in FIG. 6. The remaining pore may be filled with a heater material, such as titanium silicon nitride, which may initially fill the pore in one embodiment. The heater material may then be etched back to form the heater 30 and an upper recess which may be filled with a phase change material 32, followed by planarization, as shown in FIG. 7.

Then, the ovonic threshold switch 33 is formed by blanket depositing the middle electrode 34, followed by a glue layer 35 and the carbon film 36, followed by the ovonic threshold switch chalcogenide 38, in turn followed by another glue layer 39, the carbon film 40, and the top electrode 42. The stack may be patterned to form a dot, shown in FIG. 8.

In some embodiments, the thickness of the carbon films 36 and 40 may be less than or equal to ten percent of the thickness of the associated electrode 34 or 42. The carbon films 36 and 40 may be formed of amorphous layers formed by sputter depositions. In one embodiment, one or both carbon layers 36 or 40 may be silicon carbide. The films 36 and 40 may have thicknesses of from about 5 nm to about 10 nm, in one embodiment. In addition, the films 36 and 40 may include a glue layer to adhere each carbon film 36 or 40 to the chalcogenide 38. Suitable glue layers include titanium, titanium nitride, or titanium aluminum nitride, deposited by sputter deposition.

The electrodes 34 or 42 may be titanium aluminum nitride or titanium over titanium nitride, in one embodiment. The titanium nitride layer in the two layer titanium/titanium nitride film may be in contact with the carbon film 36 or 40.

In one embodiment, carbon may be ion mixed into the chalcogenide to form a graded contact. The graded carbon contact improves adhesion to the carbon layer in some embodiments.

Ion mixing may be achieved by depositing carbon on the chalcogenide, and then exposing the deposited carbon layer to co-sputtering of carbon. In a co-sputtering embodiment, the power of carbon and chalcogenide sputtering can be adjusted to control the carbon concentration within the chalcogenide.

Ion mixing may also be achieved by exposing a deposited carbon layer to high energy ion bombardment. In a bombardment embodiment, the bombardment causes mixture of carbon into the molecular structure of the chalcogenide. A graded contact results as the carbon concentration in the chalcogenide decreases with distance from the carbon/chalcogenide interface. In one embodiment argon ion accelerated to 300 kev may be used to bombard thin carbon layers deposited on the chalcogenide.

Carbon films 36 or 40 of this thickness range may provide good cycling endurance without delamination problems, even if carbon is used without a glue layer, in some embodiments.

Next, a low temperature nitride encapsulation layer 46 and a high density plasma (HDP) oxide 48 may be deposited, as indicated in FIG. 1. The deposited encapsulation layer 46 and oxide 48 may be planarized using chemical mechanical planarization.

A mask may be used to pattern a via two-way row and another mask may be used to pattern the column trenches. Metallization and chemical mechanical planarization may follow to complete the via and column.

Some embodiments may exhibit improved array endurance reliability with set/reset cycling and high read cycling. Degradation may be the result of crystallization and phase segregation of the ovonic threshold material upon thermal/electrical stress. Using carbon passivation, a relatively negligible threshold voltage disturbance and degradation is experienced. After cycling, no crystallization or phase changes may be observed, in some embodiments.

Figure 9:
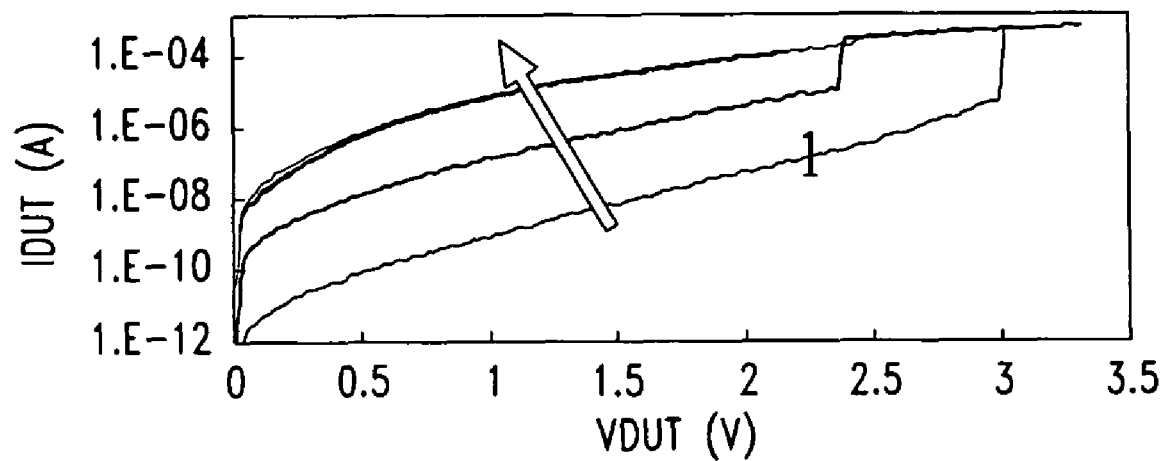
FIG. 9 is a voltage/current plot for repeated switchings of a prior art OTS device.
Figure 10:
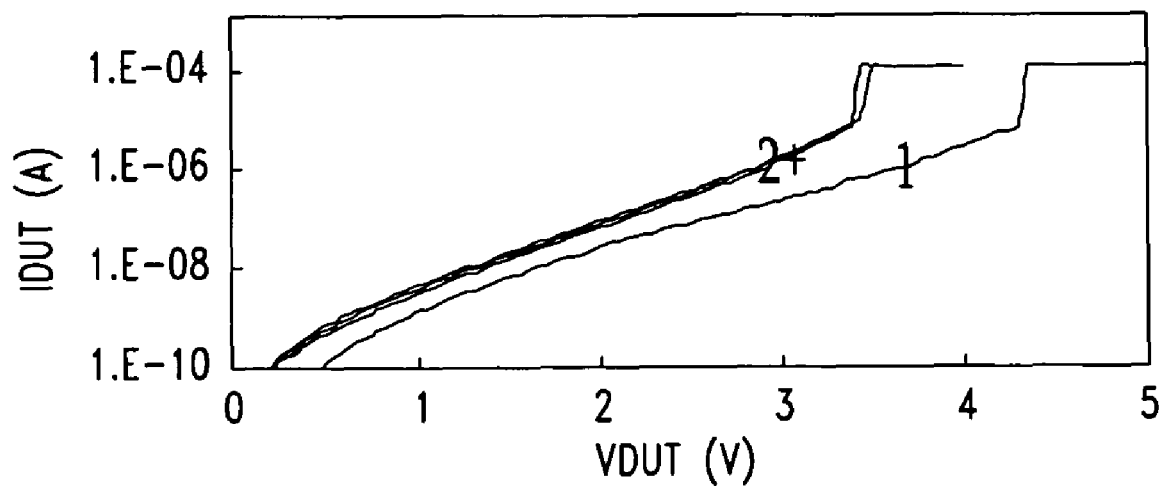
FIG. 10 is a voltage/current plot for repeated switchings of an embodiment of a carbon-passivated OTS device.

For example, by comparing FIGS. 9 and 10 one can appreciate a difference in threshold degradation of a prior art OTS device (FIG. 9) compared to a carbon-passivated OTS device according to one embodiment (FIG. 10). FIGS. 9 and 10 are voltage/current plots for repeated switchings of the prior art OTS device and the carbon-passivated OTS device, respectively. FIG. 9 shows that the repeated switching of the prior art OTS device causes a degradation of the threshold voltage to almost zero. At that point, it is substantially not operating as a switch in that any non-zero voltage produces a substantially flat current response through the OTS device. In contrast, FIG. 10 shows that, even with repeated switching, the carbon-passivated device exhibits a well-defined and stable threshold voltage.

Figure 11:
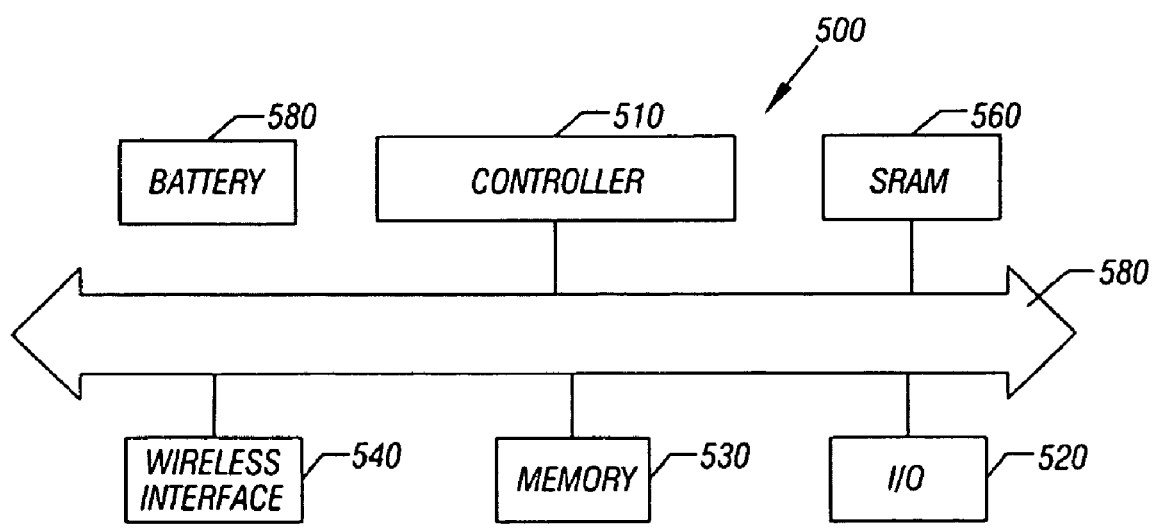
FIG. 11 is a system depiction for one embodiment.

Turning to FIG. 11, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g., a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An ovonic threshold switch comprising:
a first electrode having a thickness;
an ovonic threshold switching material;
a first carbon layer between said first electrode and said ovonic threshold switch material; and
a glue layer adhering the carbon layer to said first electrode.

2. The switch of claim 1 wherein said first carbon layer and said first electrode are under said ovonic threshold switching material.

3. The switch of claim 2 including a second carbon layer and a second electrode over said ovonic threshold switching material.

4. The switch of claim 1, wherein said first carbon layer has a thickness of less than ten percent of the thickness of said first electrode.

5. The switch of claim 4 wherein said glue layer includes one of titanium, titanium nitride, and titanium aluminum nitride.

6. The switch of claim 1 wherein carbon is ion mixed into the ovonic threshold switching material, forming a graded contact.

7. The switch of claim 1 wherein the first carbon layer includes silicon carbide.

8. The switch of claim 1 wherein said first carbon layer includes amorphous material.

9. The switch of claim 1 wherein said first carbon layer has a thickness of about 5 to about 10 nm.

10. The switch of claim 1 wherein said ovonic threshold switching material is an amorphous chalcogenide.

11. A method comprising:
forming an ovonic threshold switch, including:
forming a first electrode having a thickness;
forming ovonic threshold switching material;
forming a first carbon layer between said first electrode and said ovonic threshold switching material; and
ion mixing carbon into said ovonic threshold switching material to form a graded contact.

12. The method of claim 11 including forming said first electrode and said first carbon layer under said ovonic threshold switching material.

13. The method of claim 12 including forming a second carbon layer and a second electrode over said ovonic threshold switching material.

14. The method of claim 11 including forming a glue layer between said first carbon layer and said first electrode.

15. The method of claim 11, wherein said first carbon layer has a thickness of less than or equal to ten percent of the thickness of said first electrode.

16. The method of claim 11 including forming said ovonic threshold switching material of amorphous chalcogenide.

17. The method of claim 11 including forming said first carbon layer with a thickness of between about 5 and about 10 nm.

18. The method of claim 11 including forming an ovonic unified memory coupled to the ovonic threshold switch using said chalcogenide material over an ovonic unified memory.

19. The method of claim 11 wherein said first electrode, said ovonic threshold switching material, and said first carbon layer are planar, stacked layers.

20. A system comprising:
a processor; and
a phase change memory coupled to the processor, said memory including:
an ovonic threshold switch coupled to said processor, said ovonic threshold switch including a first electrode, a ovonic threshold switching material, and a first carbon layer between said first electrode said ovonic threshold switching material; and
an ovonic unified memory underlying the switch.

21. The system of claim 20 wherein said first carbon layer and said first electrode are under said ovonic threshold switching material and said ovonic threshold switch includes a second carbon layer and a second electrode over said ovonic threshold switching material.

22. The system of claim 20 wherein said first carbon layer has a thickness of about 5 to about 10 nm.

23. The system of claim 20 including a glue layer adhering the first carbon layer to said first electrode.

24. The system of claim 23 wherein said glue layer includes one of titanium, titanium nitride, and titanium aluminum nitride.

25. The system of claim 20 wherein carbon is ion mixed into the ovonic threshold switching material, forming a graded contact.

26. The system of claim 20, wherein said first carbon layer has a thickness of less than ten percent of a thickness of said first electrode.

27. An ovonic threshold switch comprising:
a first electrode having a thickness;
an ovonic threshold switching material; and
a first carbon layer between said first electrode and said ovonic threshold switch material, wherein carbon is ion mixed into the ovonic threshold switching material, forming a graded contact.

28. The switch of claim 27, wherein said first carbon layer has a thickness of less than ten percent of the thickness of said first electrode.

29. An ovonic threshold switch comprising:
a first electrode having a thickness;
an ovonic threshold switching material; and
a first carbon layer between said first electrode and said ovonic threshold switch material wherein the first carbon layer includes silicon carbide.

30. The switch of claim 29, wherein said first carbon layer has a thickness of less than ten percent of the thickness of said first electrode.

31. A method comprising:
forming an ovonic threshold switch, including:
forming a first electrode having a thickness;
forming ovonic threshold switching material;
forming a first carbon layer between said first electrode and said ovonic threshold switching material; and
forming a glue layer between said first carbon layer and said first electrode.

32. The method of claim 31, wherein said first carbon layer has a thickness of less than or equal to ten percent of the thickness of said first electrode.

33. A system comprising:
a processor; and
a phase change memory coupled to the processor, said memory including:
an ovonic threshold switch coupled to said processor, said ovonic threshold switch including a first electrode, a ovonic threshold switching material, and a first carbon layer between said first electrode said ovonic threshold switching material; and
a glue layer adhering the first carbon layer to said first electrode.

34. The system of claim 33, wherein said first carbon layer has a thickness of less than ten percent of a thickness of said first electrode.

35. A system comprising:
a processor; and
a phase change memory coupled to the processor, said memory including an ovonic threshold switch coupled to said processor, said ovonic threshold switch including a first electrode, a ovonic threshold switching material, and a first carbon layer between said first electrode said ovonic threshold switching material, wherein carbon is ion mixed into the ovonic threshold switching material, forming a graded contact.

36. The system of claim 35, wherein said first carbon layer has a thickness of less than ten percent of a thickness of said first electrode.

* * * * *